United States Patent [19]

Liao et al.

[11] Patent Number: 5,422,594
[45] Date of Patent: Jun. 6, 1995

[54] MULTI-CHANNEL CARRIER WAVE GENERATOR

[75] Inventors: Jyh-Wai Liao, Taichung; Hen-Wai Tsao; Lingshown Wu, both of Taipei, all of

[73] Assignee: National Science Council, Taiwan, Prov. of China

[21] Appl. No.: 56,047

[22] Filed: Apr. 30, 1993

[51] Int. Cl.$^6$ .............................................. H03B 1/04
[52] U.S. Cl. .................................. 327/120; 333/218; 327/119; 327/113
[58] Field of Search .................... 328/16, 17, 20, 62, 328/140; 331/38, 76; 333/218; 307/271, 219.1

[56] References Cited

U.S. PATENT DOCUMENTS

| 3,358,215 | 12/1967 | Swan | 333/218 |
|---|---|---|---|
| 4,394,632 | 7/1983 | Hu | 333/218 |
| 4,531,105 | 7/1985 | Kumar | 333/218 |
| 4,723,113 | 2/1988 | Marcoux | 331/76 |
| 4,831,340 | 5/1989 | Sollner | 331/76 |
| 4,897,618 | 1/1990 | Suetanoff | 331/76 |
| 5,126,694 | 6/1992 | Montress et al. | 331/18 |

Primary Examiner—Timothy P. Callahan
Assistant Examiner—My-Trang Nu Ton
Attorney, Agent, or Firm—Townsend & Townsend Khourie & Crew

[57] ABSTRACT

A multi-channel carrier wave generator includes a signal source capable of generating a carrier wave having a frequency, a first input-match diode circuit receiving the carrier wave to correspondingly generate a plurality of harmonic waves, a first multi-way power divider electrically connected to the first input-match diode circuit to equally divide the harmonic waves, and a first multi-way filter electrically connected to the first multiple power divider to filter through the harmonic waves. Such a multi-channel carrier wave generator has the advantages of having a simple fabrication procedure, a low cost, and a low phase noise, and capable of providing a stable carrier wave and a good filtering result and of using a lower order bandpass filter.

7 Claims, 7 Drawing Sheets

MULTI-CHANNEL CARRIER WAVE GENERATOR

BACKGROUND OF THE INVENTION

The present invention relates generally to a multi-channel sub-carrier wave generator, and more particularly to a wave generator that could simultaneously generate the necessary sub-carrier waves with different frequencies.

The conventional multi-channel sub-carrier wave generator provides the sub-carrier waves by two different methods, i.e. (a) the phase locked loop (PLL) and (b) the harmonic wave generation methods.

A. The Phase-locked Loop Method (PLL)

An example generating 1.0, 1.1, 1.2, 1.3, 1.4, 1.5, 1.6, 1.7, 1.8 and 1.9 GHz sub-carrier waves (being ten sub-carrier waves having a frequency of fi ($=[1+0.1*(i-1)]$ GHz) wherein i=1, 2, ..., 10.

If the programmable microwave PLL technique is utilized, we require ten sets of individual PLL circuits for the above example. The frequencies of these ten sets of PLL are 1.0, 1.1, ..., 1.9 GHz respectively. The reference frequency can be set, for example, at 100 MHz.

In addition to the circuit complexity involved, this conventional phase-locked loop has disadvantages of being costly and power-consumptive.

The characteristics of the phase-locked loop (PLL) depend on whether the loop oscillator is a voltage-controlled oscillator (VOC) or a tunable dielectric oscillator (DSO).

TABLE I

|  | Tunable DSO | VCO |
| --- | --- | --- |
| Tuning range | narrow (<8% of center frequency) | wide |
| spectral purity frequency spectrum | good | fair |

As described in Table I, the tuning range of the tunable DSO is very narrow (<8% of the center frequency). Furthermore, one disadvantage of the tunable DSO is the higher cost involved, since it is difficult to produce. However, the spectral purity of the tunable DSO is better than that of the VCO.

If we use the tunable DSO to build a PLL, we disadvantageously require ten tunable DSOs, each with its own different center frequency. If we use the VCO for the PLL, fewer VCOs are required since VCOs have a relatively wider tuning range of 0.9–0.2 GHz or more. So far as the commonly-used VCOs are concerned, we may need only two different VCOs having tuning ranges of 0.9–1.5 GHz and 1.4–2.0 GHz, respectively.

B. The Harmonic Wave Generation Method

The harmonic wave generation method utilizes a relatively high-power reference frequency to drive a comb generator which can generate numerous harmonic waves with approximately equal intensities to be filtered to obtain the required sub-carrier waves.

In practice, a 100 MHz reference frequency is used to drive the comb generator constituted by the SRD (step-recovery diode) and then a bandpass filter is used to sequentially filter therethrough the required harmonic sub-carrier waves. In order to reduce the interference to other channels, the filter must be well-designed to eliminate any unnecessary harmonic wave to the largest extent, which is especially true when the harmonic waves are closely spaced. This is the reason why we generally use the expensive and bulky YIG tuned filter which is a significant drawback of the harmonic wave generation method.

SUMMARY OF THE INVENTION

A major objective of the present invention is to provide an economically viable multi-channel sub-carrier wave generator with a simple structure and a low phase noise.

Another objective of the present invention is to provide a multi-channel sub-carrier wave generator using simpler and lower order bandpass filters.

A further objective of the present invention is to provide a multi-channel sub-carrier wave generator capable of easily offering a host of stable sub-carrier waves with a good quality.

The present multi-channel carrier wave generator (MCCWG) includes a signal source, a first input-match diode circuit, a first multi-way power divider, and a first multi-channel filter to generate a number of odd-ordered harmonic carrier waves.

Certainly, this multi-channel carrier wave generator can further include a frequency doubler, a second input-match diode circuit, a second multi-way power divider, and a second multi-channel filter to generate a number of even-ordered harmonic carrier waves.

The signal source used in the multi-channel carrier wave generator is a stable reference frequency source. If incorporated with a power divider, the present wave generator can provide a host of harmonic carrier waves.

The first input-match diode circuit used in the above MCCWG can include a first input-match circuit, and two diodes which are anti-parallelly connected, and are fully matched with each other.

The second input-match diode circuit used in the above MCCWG can include a second input-match diode circuit and a diode.

The present invention can be better understood through the following description with reference to the accompanying drawings, in which:

DETAILED DESCRIPTION OF THE PREFERRED EMBODIMENTS

Figure 1:
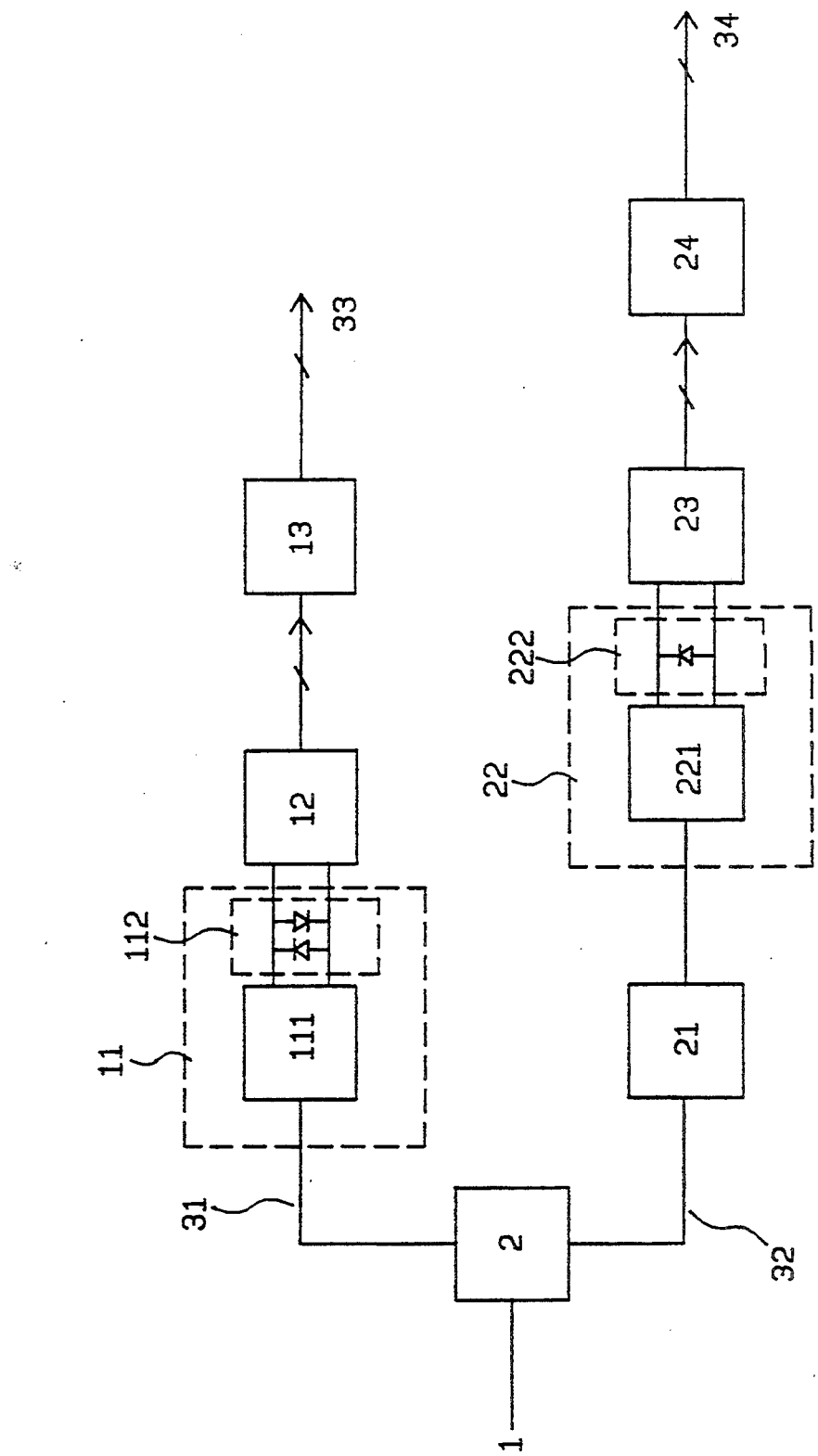
FIG. 1 shows a circuit diagram in accordance with one preferred embodiment of the present invention.

A preferred embodiment of the present multi-channel carrier wave generator, as shown in FIG. 1, includes a stable reference frequency source 1, a power divider 2, a first input-match diode circuit 11, a first multi-way power divider 12, a first multi-channel filter 13, a frequency doubler 21, a second input-match diode circuit 22, a second multi-way power divider 23, and a second multi-channel filter 24.

One major distinctiveness of the present invention is that the reference frequency is guided to pass in two ways, with one intended for the production of a number of odd-ordered harmonic carrier waves and the other for generating a number of even-ordered harmonic waves.

The operation principle of the present invention is outlined as follows:

a) The Odd-ordered Harmonic Waves

The reference frequency source 31 is used to drive two fully matched diodes anti-parallelly connected to generate harmonic carrier waves 33.

b) The Even-ordered Harmonic Waves

The frequency from the reference frequency source is doubled to obtain a doubled frequency 32 for generating the even-ordered harmonic carrier waves, which pass through a multi-way power divider 22 to be divided thereby into several ways respectively connected with several filters 24 (being multi-channel filters) to obtain the required even-ordered harmonic carrier waves 34.

Power divider 2 divides the reference signal source into two ways. The first input-match diode circuit 11 includes a first input-match circuit 111 and two diodes 112 anti-parallelly connected in order to generate a host of odd-ordered harmonic waves. The first multi-way power divider 12 can uniformly distribute the odd-ordered harmonic waves generated by the first input-match diode circuit 11. The first multi-channel filter 13 then filters therethrough a number of odd-ordered harmonic waves. The frequency doubler 21 will double the frequency of the reference frequency signal 1. The second input-match diode circuit 22 includes a second input-match circuit 221 and a diode 222 for generating a host of even-ordered harmonic waves (with respect to the reference frequency). The second multi-way power divider 23 uniformly distribute the even-ordered harmonic waves generated by the second input-match diode circuit 22. The second multi-channel filter 24 is then used to separately filter therethrough the even-ordered harmonic waves.

The characteristics of the present multi-channel carrier wave generator can be summarized as follows:

1) Since the odd- and even-ordered harmonic waves are generated separately, the density of these harmonic waves is only a half of that of those waves produced by the conventional method. The advantages of this invention includes that the order of the bandpass filter can be reduced and the passband is no longer to be extremely narrowly designed. These allow a wider shifting tolerance from the center frequency. Another advantage of the present invention is that the filter can be produced more easily.

Let us take a six-order BPF having a center frequency of 1.2 GHz as an example. If the odd- and even-numbered harmonic waves are to be generated separately, the maximum harmonic wave is 1.0 GHz with an intensity of −55 dBc (with respect to 1.2 GHz). If the present harmonic wave generation method is not used, the maximum harmonic wave then is 1.1 GHz with an intensity of −30 dBc. This illustration is based on the assumption that the intensities of 1.0, 1.1 and 1.2 GHz waves are the same, although a difference of about 3 dBc does exist thereamong. As illustrated by this example, the advantage of the present invention in wave filtering is apparent so that it can feasibly be put into practical applications. Since the generated carrier waves are used for wave-mixing local oscillator (L.O.), harmonic waves will desensitize the wave-mixer and thus increase the conversion loss during the wave-mixing process.

Figure 2:
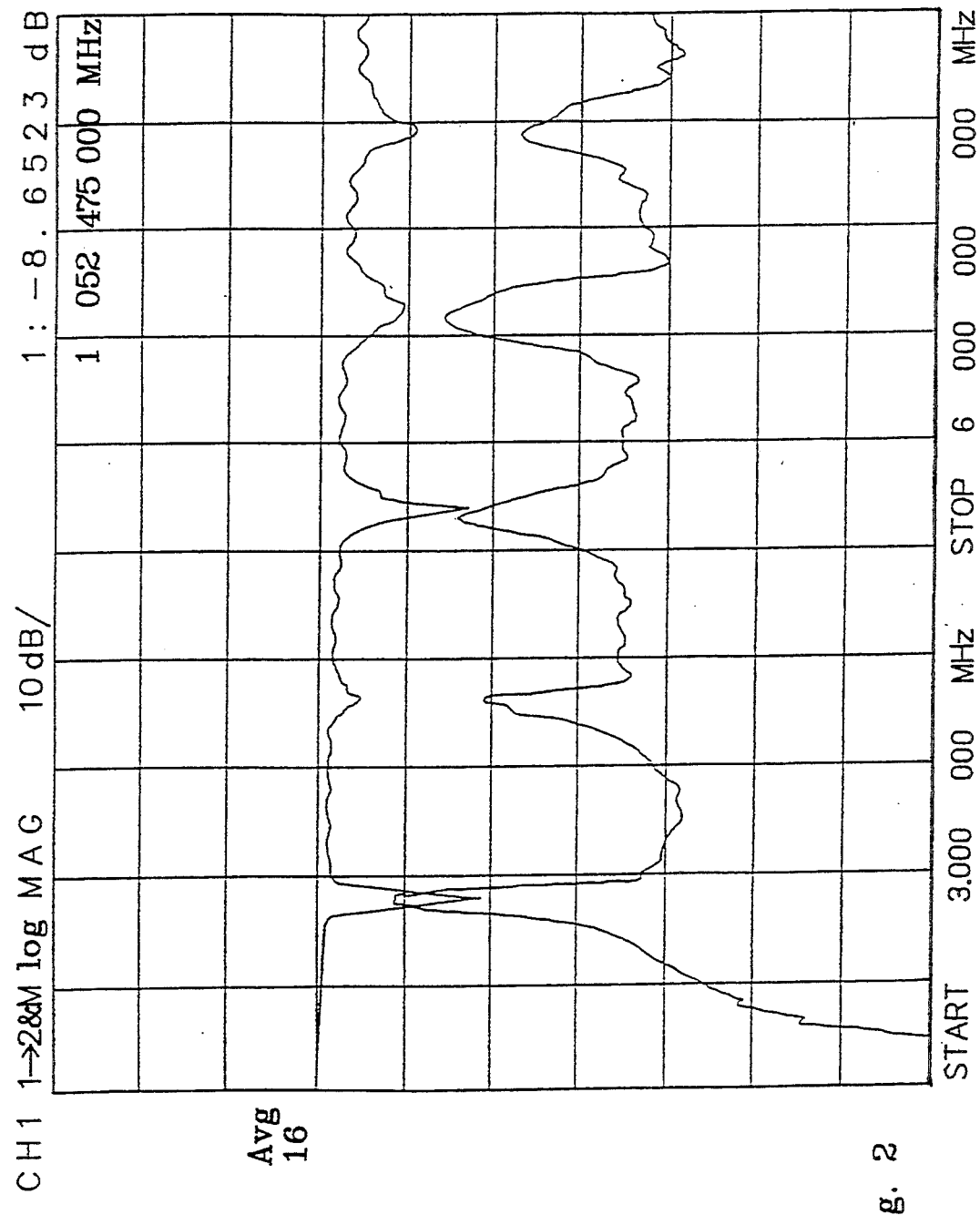
FIG. 2 is a diagram showing the transmission and reflection coefficients as functions of the frequency of the bandpass filter according to the present invention.

2) The most commonly used bandpass filter in microwave circuits is the edge couple line BPF which, being of a resonant cavity type filter, is capable of passing therethrough not only the designed center frequency fo, but other harmonic waves as well. The frequency response of a 6th-order bandpass filter is shown in FIG. 2. Although the center frequency thereof is 1.1 GHz, other frequencies such as 2.2 GHz, 3.3 GHz, 4.4 GHz and 5.5 GHz, ... etc. (known as spurious passbands) can also pass therethrough which can be verified by a network analyzer. If the odd- and even-numbered waves are to be separately generated, the output of the odd-numbered harmonic waves will not include therein the 2.2 GHz and 4.4 GHz carrier waves, even though the 2.2 GHz wave can pass through the BPF. This illustrates that the generated odd-ordered carrier waves only include harmonic waves at the frequencies of $3*f(2n+1)$, $5*f(2n+1)$, $7*(f2n+1)$, ..., etc. wherein $f(2n+1)=1.1$ GHz.

3) Another advantage of this carrier wave generator is that the output carrier waves would always be stable so long as the input reference frequency is stable. In a bank of conventional phase-locked loops, if one loop is out of lock, the frequency shifting may interfere with the transmission of the neighboring carrier waves. Therefore the harmonic wave generation method is further superior to the phase-locked loop method both in reliability and testability. Other advantages of the present invention further include that it has a simple manufacturing procedure, a low production cost, a low phase noise, and so on.

In order to better demonstrate the distinctiveness of the present multi-channel carrier wave generator, the experimental results of the present wave generator are illustrated and shown in FIGS. 3–7.

Figure 3:
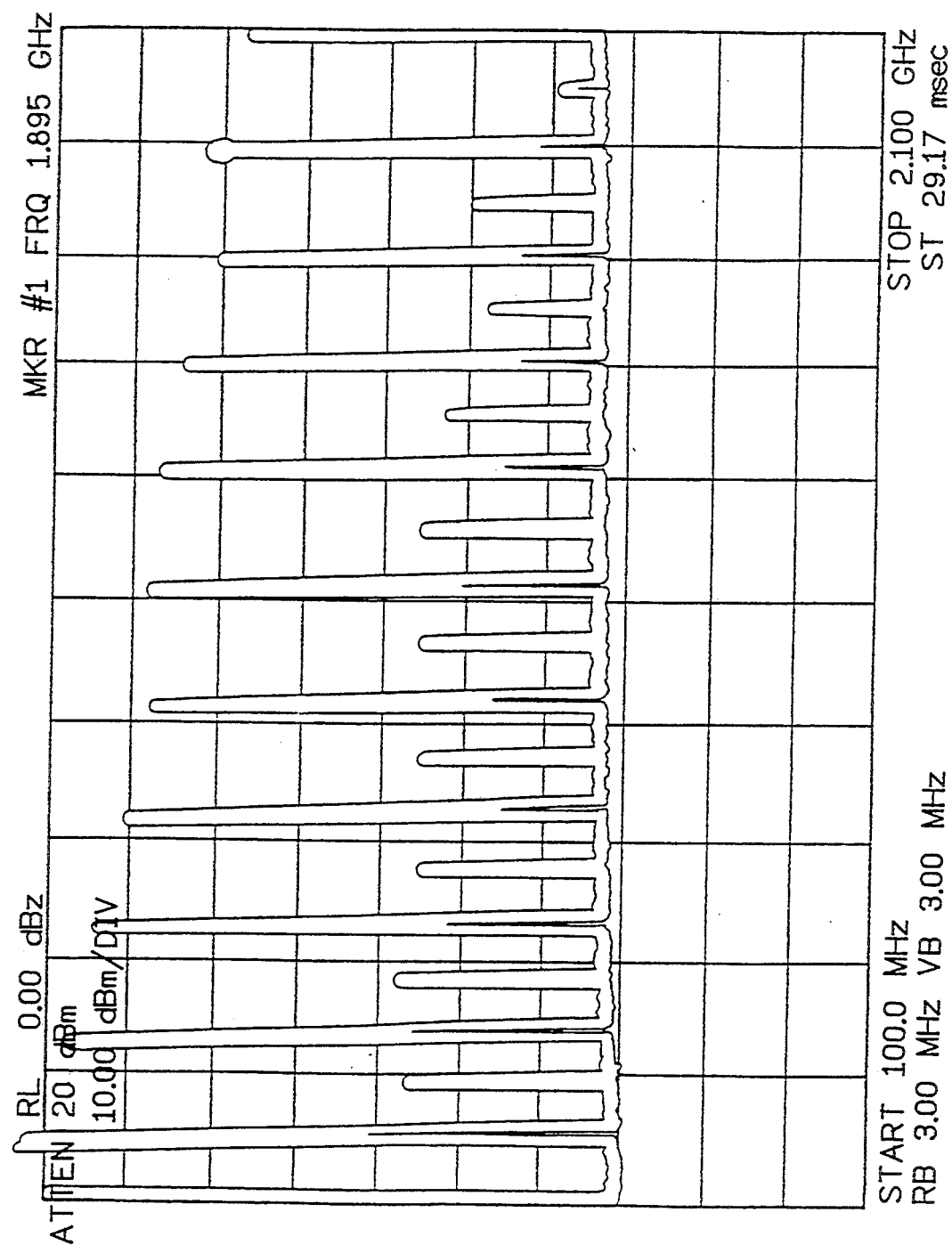
FIG. 3 shows a first experimental result of the present invention.

FIG. 3 shows the output of the odd comb when a 14 dBm, 100 MHz frequency is used as the input signal and shows that the counteracting effect of the even-ordered harmonic waves is apparent. Even in the worst scenario, −30 dBc (with respect to the most adjacent left or right odd harmonic frequency) is noticed. This result is obtained by butting the pins of the SMT package since there is no packaged anti-parallel SRD commercially available thus far.

Figure 4:
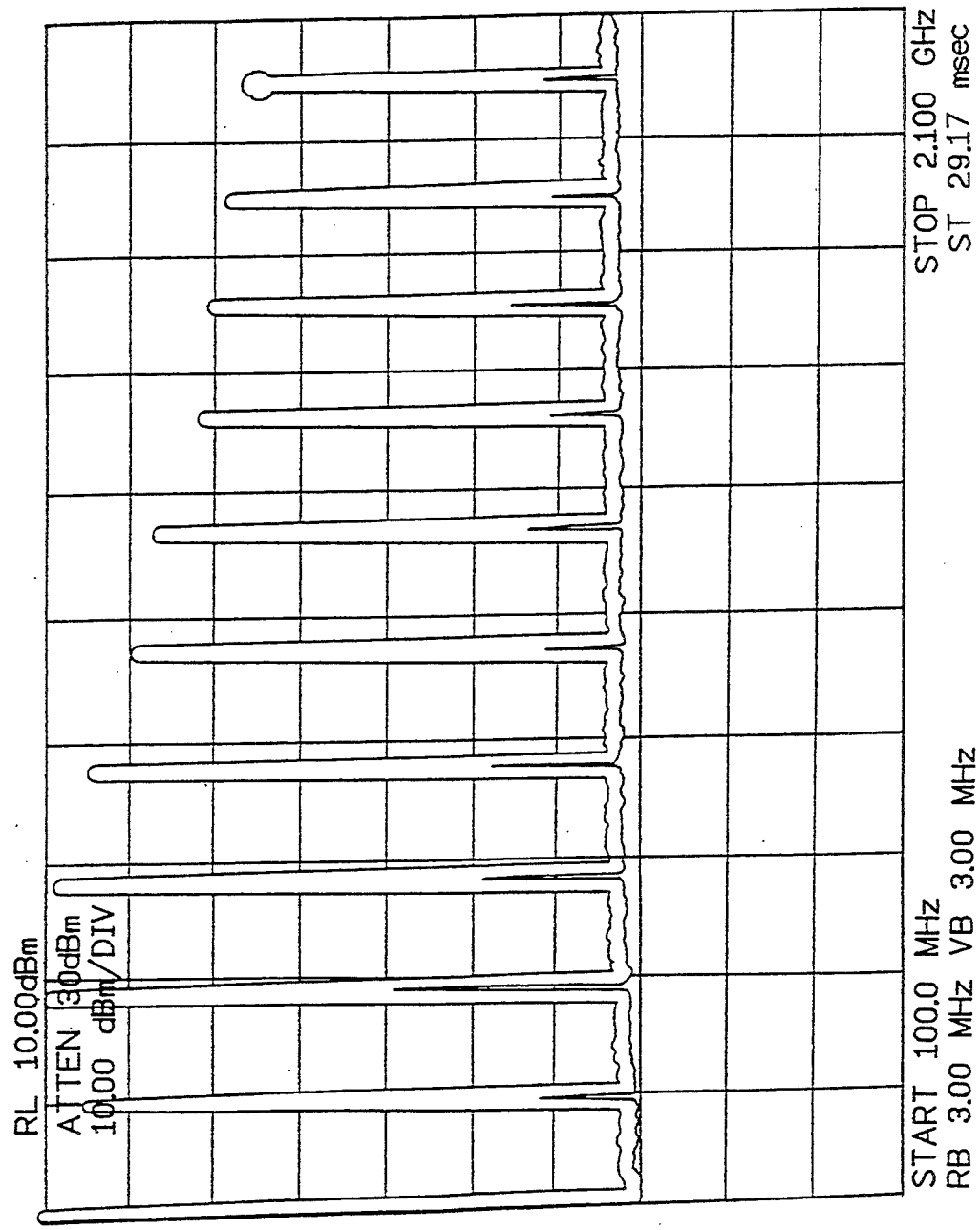
FIG. 4 shows a second experimental result of the present invention.

FIG. 4 is the output of the even comb when a 17 dBm, 200 MHz frequency is used as the input signal.

Figure 5:
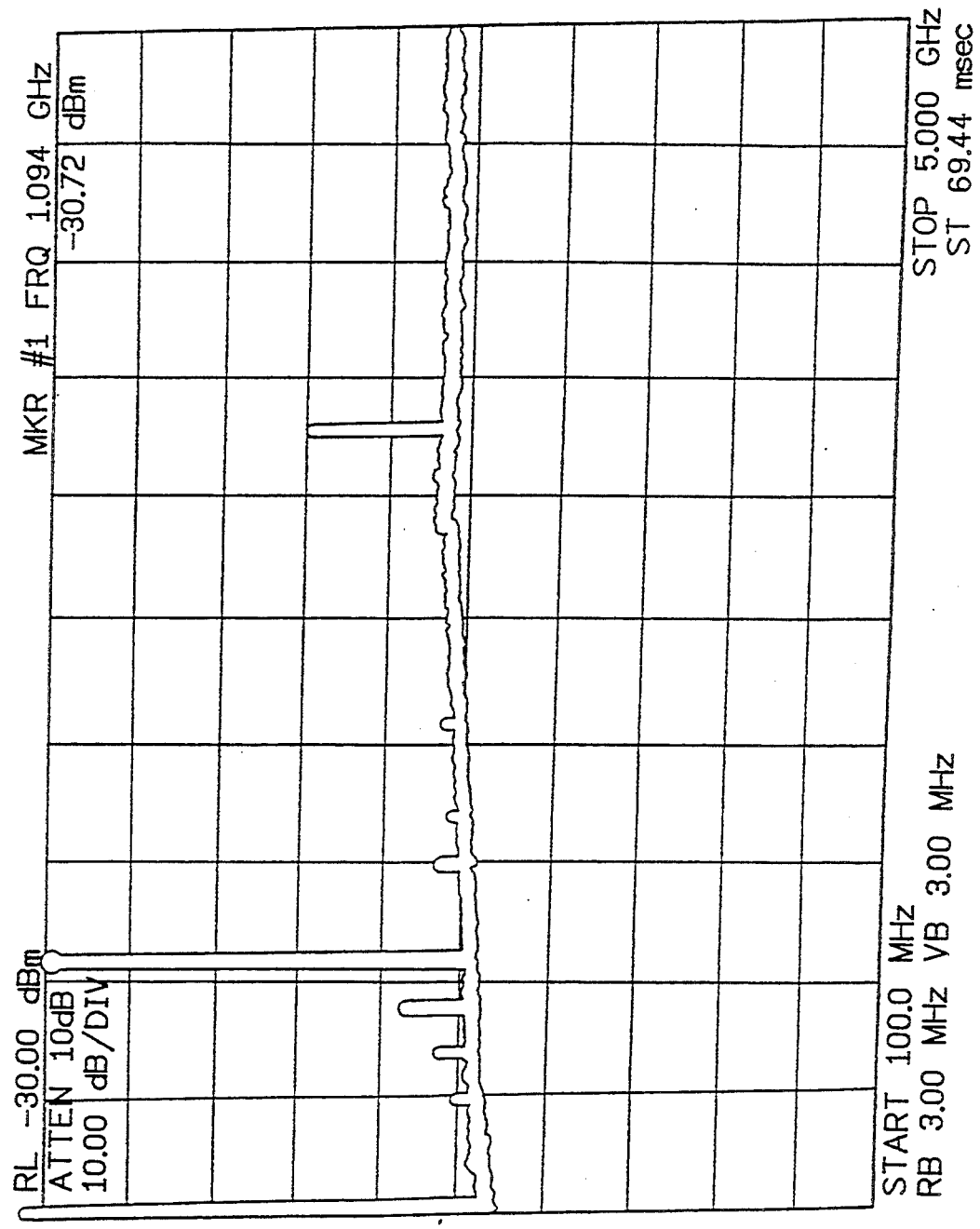
FIG. 5 shows a third experimental result of the present invention.

FIG. 5 illustrates one of the characteristics of the odd comb having the output thereof (in FIG. 3) connected to a 5-way power divider (e.g. the first multi-way power divider 12 in FIG. 1). The carrier waves are filtered through a 6-stage edge-couple line BPF (e.g. the first multi-channel filter 13 in FIG. 1) centered at 1.1 GHz and having the S-parameter thereof shown in FIG. 2 which shows that all of the spurious responses of the filter have passbands at 2.2, 3.3, 4.4 and 5.5 GHz. FIG. 5 shows, however, that there is no spurious carrier wave at 2.2 and 4.4 GHz. It is therefore known that such characteristics of the odd comb are practicable. Furthermore, the loss of the BPF is about 9 dB attributable to the substrate material (having a loss tangent tan $\delta = 0.02$).

Figure 6:
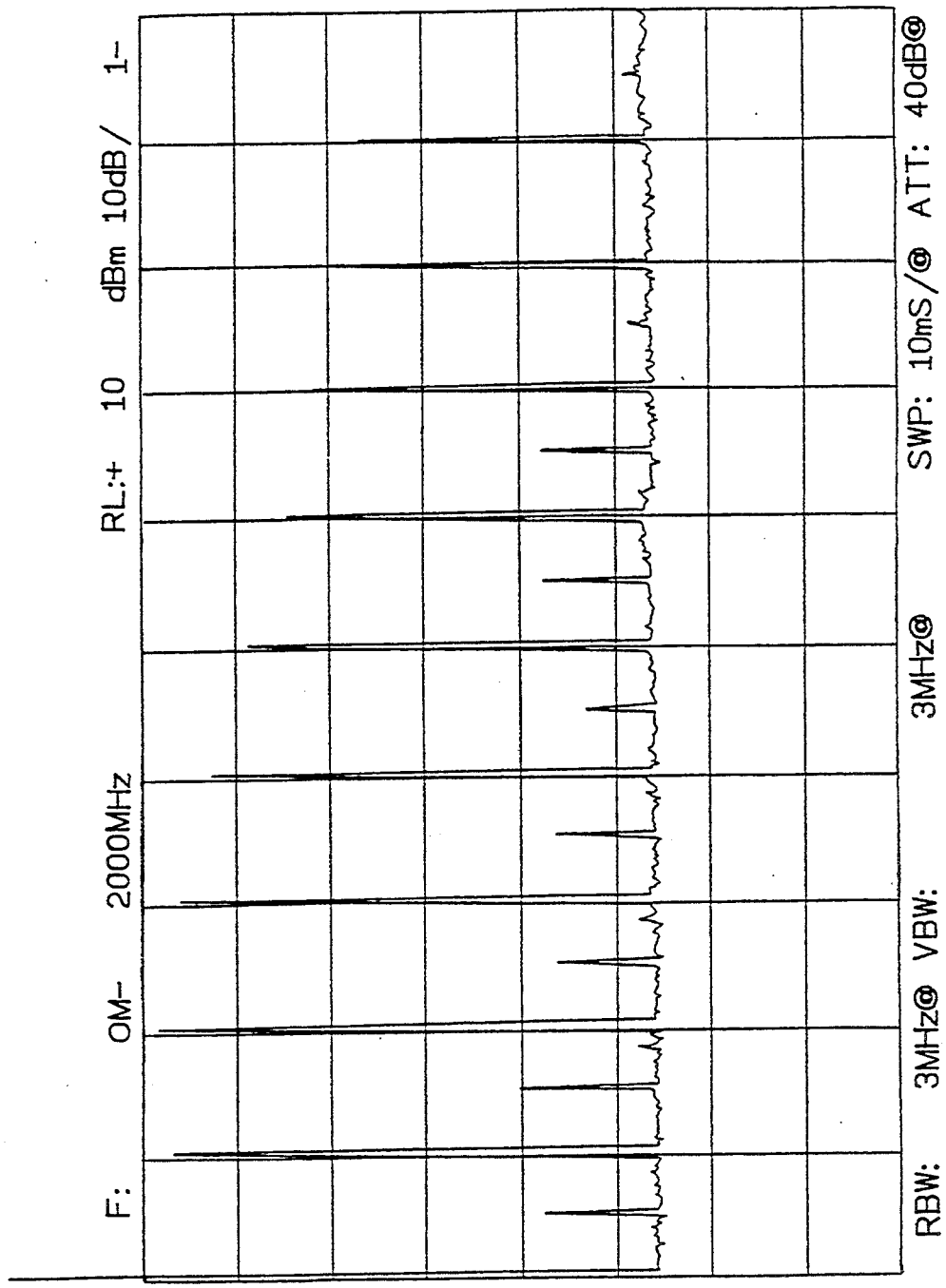
FIG. 6 shows a fourth experimental result of the present invention.

FIG. 6 also shows the output of the even comb. The difference between the outputs shown in FIG. 6 and FIG. 4 is that since in FIG. 6, the 100 MHz reference frequency has been doubled to a 200 MHz frequency by the frequency doubler 21, the output of which still has some 100 MHz ingredient, to drive the even comb, the output of which will have a few odd-numbered harmonic waves.

The issue of the filtered carrier waves having a very small power can be resolved by the amplification method. In fact, if a MMIC Gilbert cell mixer is to be driven, the required L.O. power will be only −10 dBm. Therefore, each comb needs only keep the output power level of each desired harmonic wave larger than 0 dBm. In the practical application shown in FIG. 1, when the power divider (with 8 dB loss) and the filter (using a substrate having a tan δ (loss tangent)<0.005 to maintain the loss less than 2 dB) are used, the output power level of each carrier wave will be larger than −10 dBm so that we can use the Gilbert cell mixer for wave mixing without amplification.

Figure 7:
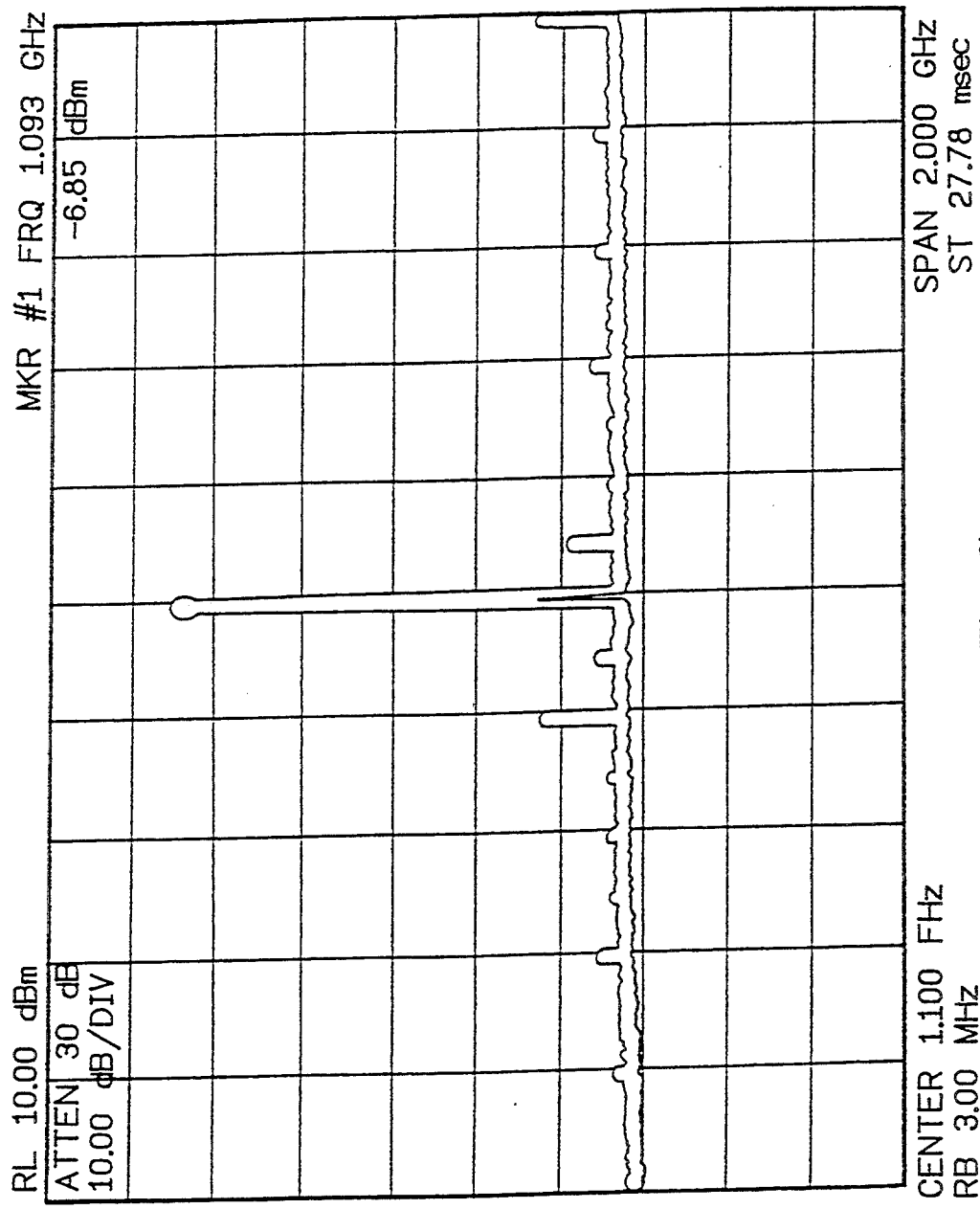
FIG. 7 shows a fifth experimental result of the present invention.

FIG. 7 shows that a −31 dBm, 1.1 GHz signal in FIG. 5 can be amplified to a −7 dBm one relatively easily.

What is claimed is:

1. A multi-channel carrier wave generator comprising:
   a signal source capable of generating a carrier wave having a frequency;
   a first input-match diode circuit having a linear passive input stage matched at said frequency and receiving said carrier wave to correspondingly generate a plurality of harmonic waves of said carrier wave on an output of said input-match diode circuit;
   a first multi-way power divider electrically connected to said first input-match diode circuit and having said plurality of harmonic waves as an input, to equally divide said harmonic waves among plurality of isolated outputs of said first multi-way power divider; and
   a first multi-channel filter electrically connected to said first multi-way power divider to separate said harmonic waves by frequency.

2. A multi-channel carrier wave generator as claimed in claim 1, wherein said harmonic waves are a plurality of odd harmonic waves.

3. A multi-channel carrier wave generator as claimed in claim 2, comprising:
   a frequency doubler electrically connected to said signal source to double said frequency;
   a second input-match diode circuit having a linear passive input stage matched at double said frequency and receiving an output of said frequency doubler to correspondingly generate a plurality of even harmonic waves on an output of said second input-match diode circuit;
   a second multi-way power divider electrically connected to said second input-match diode circuit and having said plurality of even harmonic waves as an input to equally divide said even harmonic waves among plurality of isolated outputs of said second multi-way power divider; and
   a second multi-channel filter electrically connected to said second multi-way power divider to separate said even harmonic waves by frequency.

4. A multi-channel carrier wave generator as claimed in claim 3, wherein said signal source is a stable reference frequency source.

5. A multi-channel carrier wave generator as claimed in claim 3, further comprising a power divider having an input and two isolated outputs with said input electrically connected to said signal source and said isolated outputs providing two signals to said first input-match diode circuit and said frequency doubler respectively.

6. A multi-channel carrier wave generator as claimed in claim 3, wherein said first input-match diode circuit includes
   two anti-parallelly connected step recovery diodes electrically connected to said input stage to correspondingly generate a plurality of uniform odd harmonic waves.

7. A multi-channel carrier wave generator as claimed in claim 6, wherein said anti-parallelly connected diodes are included within a single package and fully matched with each other.

* * * * *